US 6,614,172 B2

(12) United States Patent
Chiu et al.

(10) Patent No.: US 6,614,172 B2
(45) Date of Patent: Sep. 2, 2003

(54) HIGH EFFICIENCY WHITE LIGHT EMITTING DIODE

(75) Inventors: Chien-Chia Chiu, Taipei (TW); Chiu-Ling Chen, Chu-Tung Chen (TW); Kwang-Kuo Shih, Chu-Tung Chen (TW)

(73) Assignee: Industrial Technology Research Institute, Hsinchu (TW)

( * ) Notice: Subject to any disclaimer, the term of this patent is extended or adjusted under 35 U.S.C. 154(b) by 345 days.

(21) Appl. No.: 09/726,461

(22) Filed: Nov. 30, 2000

(65) Prior Publication Data

US 2001/0010449 A1 Aug. 2, 2001

(30) Foreign Application Priority Data

Feb. 2, 2000 (TW) ........................................ 89101794 A

(51) Int. Cl.[7] .................................................. H01J 1/62
(52) U.S. Cl. ...................... 313/501; 313/512; 257/98; 257/99; 257/100
(58) Field of Search ................... 313/501, 512, 313/498, 110, 112; 257/98, 99, 100, 81

(56) References Cited

U.S. PATENT DOCUMENTS

| 5,315,491 | A | * | 5/1994 | Spencer et al. | ................ | 362/84 |
| 6,259,204 | B1 | * | 7/2001 | Ebisawa et al. | ............ | 313/512 |
| 6,441,551 | B1 | * | 8/2002 | Abe et al. | ................... | 313/503 |

* cited by examiner

Primary Examiner—David V. Bruce
Assistant Examiner—Elizabeth Gemmell
(74) Attorney, Agent, or Firm—J.C. Patents

(57) ABSTRACT

A high efficiency white light emitting diode, having a light emitting diode chip, a transparent substrate, a transparent Ohmic electrode, a reflection layer, a contact diode and covered with submount with a conductive trace. The transparent substrate having a rough surface is disposed on a first surface of the chip. The transparent Ohmic electrode is disposed on a second surface of the chip and coupled with the contact electrode. The submount with the conductive trace used to carry the chip has a high thermal conductivity. The conductive trace is electrically connected to the contact electrode on the chip by soldering material. The surface of the chip is covered with fluorescent paste to absorb a portion of the light generated by the light emitting diode and to emit a complementary light, so that the observer can observe a white light.

23 Claims, 4 Drawing Sheets

HIGH EFFICIENCY WHITE LIGHT EMITTING DIODE

CROSS-REFERENCE TO RELATED APPLICATION

This application claims the priority benefit of Taiwan application Ser. No. 89101794, filed Feb. 2, 2000.

BACKGROUND OF THE INVENTION

1. Field of the Invention

The invention relates in general to a light emitting diode. More particularly, this invention relates to a high efficiency white light emitting diode.

2. Description of the Related Art

The light emitting diode is a semiconductor device with high conversion efficiency to convert an electric energy into an optical energy. The theory of the light source is a junction of a P-type semiconductor and an n-type semiconductor. When the P-type and N-type semiconductors are connected to a positive and a negative electrodes, respectively, a forward bias is applied, the holes in the P-type and the electrons in the N-type semiconductor combine at the PN junction to emit a light. Currently, various light emitting diodes such as red light emitting diodes, yellow light emitting diodes have been developed and mass-produced.

The white light emitting diode using a blue light emitting diode as a light source has been developed. Using a fluorescent powder to partly absorb the blue light and to convert it into yellow or courge green (yellowish green) light, the remaining blue light and the converted yellow or courge green light are combined as a white light. FIG. 1 shows a structure of a conventional white light emitting diode disclosed by Nichia Chemical Industries, LTD in European Patent EP0936682. As shown in FIG. 1, the structure using a blue light emitting diode 102. The emitting surface is upwardly disposed, while the substrate 104 is downwardly disposed in a reflector 106 of a lead frame 112. Using wire bonding, the conductive wires 108 are fabricated. A fluorescent power of yttrium aluminum garnet (YAG) containing ccrium (Ce) is used to cover the blue light emitting diode 102. A molding step is then performed using an epoxy 110. A white light emitting diode 100 is fabricated in a form of a lamp.

The above white light emitting diode has a smooth surface. According to Snell Law, the critical angle $\theta_c = \sin^{-1}(n_2/n_1)$, wherein $n_1$ and $n_2$ are the refractive index of the semiconductor and the surrounding material. In this example, $n_1=3.4$, $n_2=1.5$, and $\theta_c=27°$, so that only the light at a cone with an angle of $2\theta_c$ can project through the semiconductor surface. Therefore, the efficiency of the output light is seriously restricted. In addition, using the above arrangement, even the substrate is facing downwardly, the P-electrode and the N-electrode co-exist in the light surface, so that a part of the electrode surface blocks the projection of light generated by the chip. The light efficiency is further reduced.

FIG. 2 shows a conventional flip chip (F/C) type blue emitting diode and the fabrication method thereof. The disclosure is polished in World Patent WO 98/34285 by Matsushita Electronics Corporation. In FIG. 2, the blue light emitting diode 200 has its transparent substrate 212 disposed upwardly, and the light emitting diode chip facing downwardly. The P-electrode 204a and N-electrode 204b are connected to the N-electrode 206a and P-electrode 206b respectively via the gold micro bumps 214a and 214b. The silicon substrate 202 is mounted on the lead frame 208. The conductive wires 210 are formed by wire bonding. Further by performing a molding step, the blue light emitting diode is formed.

In the above blue light emitting diode, the blue light emitting diode chip is mounted on the silicon substrate. When an operation current is 20 milli-Ampere (mA), the thermal and the electrical properties of the silicon substrate can be used as the submount of the light emitting diode chip. However, for a high efficiency light emitting diode, the operation current is larger, so that the demand on the properties of the submount is higher. The silicon substrate is thus not suitable for being used as the submount any more.

SUMMARY OF THE INVENTION

The invention provides a white light emitting diode. The surface of the light emitting diode chip is roughened to increase the probability of light entering the critical angle, so as to increase the output efficiency. In addition, using a flip chip structure, the blockage of light by the electrode is avoided to further enhance the light efficiency. The invention adapts a material with a high thermal conductivity as the submount, both the output and input efficiency are enhanced.

The high efficiency white light emitting diode provided by the invention comprises a light emitting diode chip, a transparent substrate, a transparent Ohmic electrode, a reflection layer, a contact electrode and a submount with a conductive trace. The transparent substrate having a roughened surface is disposed on a first surface of the light emitting diode chip. The transparent Ohmic electrode is located on a second surface of the light emitting diode chip. The reflection layer is formed on the transparent Ohmic electrode. The contact electrode is disposed on the reflection layer and connected to the Ohmic electrode. A submount with a high thermal conductivity is used to carry the light emitting diode chip. The conductive trace on the submount is electrically connected to the contact electrode on the chip by soldering material. The chip surface further comprises a fluorescent paste to absorb a part of the light emitted by the light emitting diode and to emit a complementary light to enable an observer to see a white light.

Both the foregoing general description and the following detailed description are exemplary and explanatory only and are not restrictive of the invention, as claimed.

DESCRIPTION OF THE PREFERRED EMBODIMENTS

First Embodiment

Figure 3:
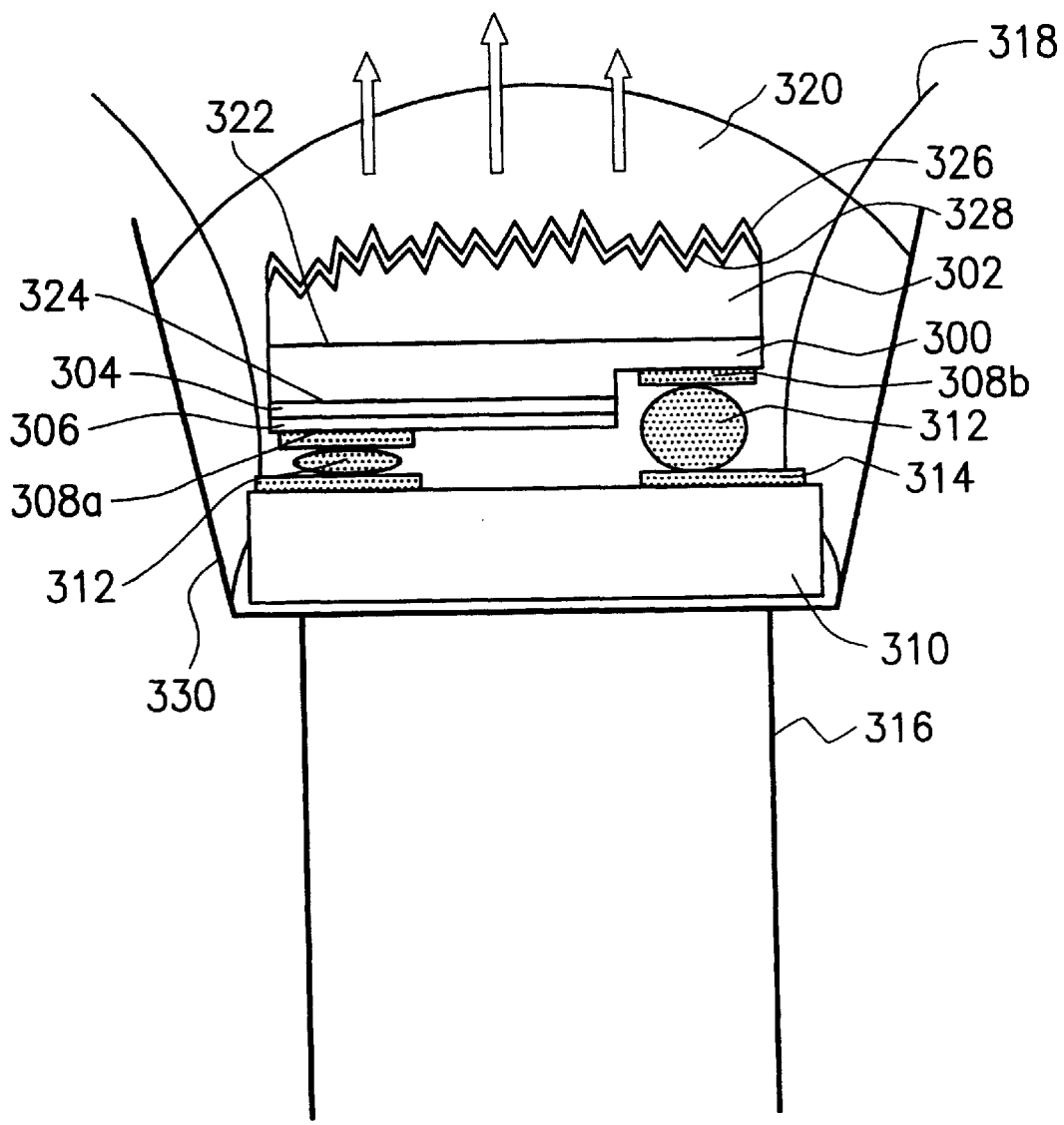
FIG. 3 shows a structure of a white light emitting diode comprising a metal reflection layer according to a first embodiment of the invention.

In FIG. 3, a first embodiment of the invention is illustrated. In the first embodiment, a high efficiency white light emitting diode is provided. The white light emitting diode comprises a light emitting diode chip 300, a transparent substrate 302, an anti-reflection layer 326, a transparent Ohmic layer 304, a reflection layer 306, contact electrodes 308a and 308b, a submount 310, a soldering material 312 and a fluoresecent paste 320. The light emitting diode chip 300 has a first surface 322 and a second surface 324. The transparent substrate 320 has a roughened surface. The submount 310 used to carry the light emitting diode chip 300 comprises a conductive trace 314.

As shown in FIG. 3, the transparent substrate 302 is disposed on the first surface 322 of the light emitting diode chip 300. The surface opposite to the joining surface of the light emitting diode chip 300 is roughened. The transparent Ohmic electrode 304 is disposed on the second surface 324 of the light emitting diode chip 300. The reflection layer 306 is formed on the transparent Ohmic electrode 304. That is, the transparent Ohmic electrode 304 is disposed between the light emitting diode chip 300 and the reflection layer 306. A first contact electrode 308a and a second contact electrode 308b are formed on the reflection layer 306 and an edge portion of the light emitting diode 300. The transparent Ohmic electrode 304, the reflection layer 306 and the first contact electrode 308a are the P-type electrode, and the second contact electrode 308b is the N-type electrode.

The contact electrodes 308a and 308b on the light emitting diode chip 300 are electrically connected to the external source (not shown) and the conductive trace 314 on the submount 310 by the soldering material 312. On the roughened surface 328 of the transparent substrate 302, an anti-reflection coating (ARC) 326 can be formed to suppress the reflection of the light emitted from the light emitting diode chip 300 from the roughened surface 328. The light can thus projects through the roughened surface 328 with an enhanced efficiency. The anti-reflection layer 328 is preferably formed conformal to the roughened surface 328.

The above light emitting diode chip 300, the submount and other devices are disposed in a reflector 330 on a lead frame 316. The conductive wire 318 is formed between the conductive trace 314 on the submount 310 and the lead frame 316 for electric connection. The material of the conductive wire 318 comprises gold (Au) and aluminum (Al). The method for forming the conductive wire 318 includes wire bonding. In the reflector 330 on the lead frame 316, a fluorescent paste 320 is formed to cover the anti-reflection layer 326, the transparent substrate 302, the light emitting diode chip 300 and the submount 310. The fluorescent paste receives a portion of the light generated by the light emitting diode chip 300 and to generate a complement light to enable an observer to see a white light.

Figure 1:
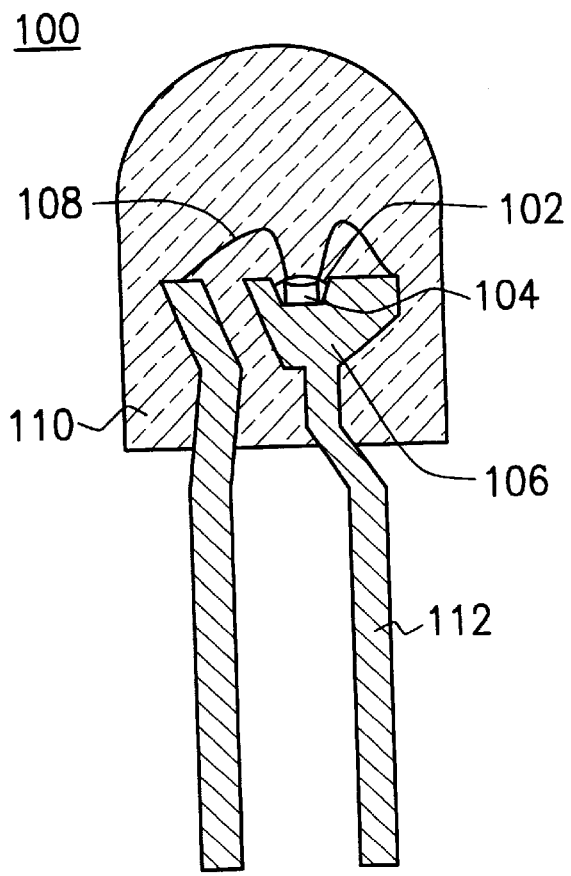
FIG. 1 shows a structure of a conventional white light emitting diode.
Figure 2:
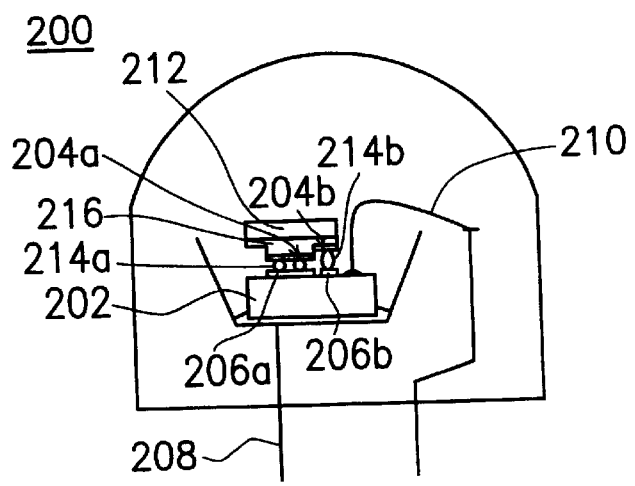
FIG. 2 shows a structure of a conventional flip chip type blue light emitting diode.

In the conventional structure of the white light emitting diode (referring to FIG. 1), as the light emitting diode chip has a smooth surface, the output efficiency of the light is only 10%. To enhance the output efficiency of the light, the invention roughens the surface of the light emitting diode chip, so that the matching conditions of between incident and outgoing lights of the interface are varied. The roughened surface increases the probability of an incident light to enter a critical angle. The increase is especially significant when the incident light has been reflected several times.

The invention adapts a flip chip structure and disposes the transparent substrate 302 on the light emitting diode chip 300, so that the transparent substrate 302 is jointed with the first surface 322 the light emitting diode chip 300, and the transparent substrate 302 provides a roughened surface 328. The method for forming the roughened surface 328 includes the follows. Performing a polishing step on the surface of the transparent substrate, so that as irregular rough surface can be resulted. Alternatively, a photolithography and etching technique is used to form a regularly or periodically rabbet surface. The surface roughness of the roughened surface 328 is preferably between about 0.1 micron to about 1.0 micron. The anti-reflection layer 326 is provided to enhance the efficiency of the light output.

As mentioned above, the transparent Ohmic electrode 304 is disposed on the second surface of the light emitting diode chip 300. Because the P-type crystal of the light emitting diode chip 300 has a good Ohmic contact, so that the current distributes on the P-type crystal evenly without causing the light blockage. Furthermore, it is advantageous to the effect of the reflection layer 306. The reflection layer 306 on the transparent Ohmic electrode 304 can be made of a metal plating material or non-metal material. In this embodiment, the material of the refection layer 306 includes the metal plating layer with high reflectivity. Since the reflection layer 306 does not have to form an Ohmic contact with the P-type crystal, the material for making the reflection layer 306 includes pure metal, such as silver and aluminum.

The first contact electrode 308a and the second electrode 308b located on the reflection layer 306 and the edge portion of the light emitting diode chip 300 provides a path for the light emitting diode chip 300 to connect an external device. The current can thus be conducted from external of the light emitting diode chip 300 to the transparent Ohmic electrode 304 of the light emitting diode. Since the material for forming the reflection layer 306 is metal plating material, the first contact electrode 308a can thus be formed on the reflection layer 306 directly. The contact electrodes 308a and 308b have very good solderablility to joint with the soldering material 312. The diffusion of the soldering material 312 to the transparent Ohmic electrode 304 that causes device deterioration can also be prevented. The contact electrodes 308a and 308b are thus formed by two or more than two metal layers. The material of the inter-metal to joint the reflection layer 306 includes platinum (Pt) and nickel (Ni), and the outer metal layer for jointing the soldering material 312 includes gold and copper.

In the conventional structure of the lamp type light emitting diode, a silver paste is used to mount a light emitting diode on a lead frame. When the operation current is larger than 20 mA, due to the thermal conductivity and thermal expansion coefficient, the device deterioration is caused, so that the conventional structure is not suitable for high efficiency light emitting diode. The invention uses a material with high thermal conductivity and a thermal expansion coefficient similar to the light emitting diode chip as the submount 310 for the light emitting diode chip. Furthermore, a soldering material 312 is used to replace the silver paste to mount the light emitting diode chip 300 and the submount 310. A flip chip type is used to fix the light emitting diode chip 300 on the submount 310. The soldering material 312 includes a tin-gold (AuSn) alloy, a tin-lead (PbSn) alloy, a tin-silver (AgSn) alloy and indium.

The submount 310 is made of a material with a high thermal conductivity such as silicon carbide (SiC), aluminum nitride (AlN), aluminum oxide ($AlO_x$), and a diamond thin film formed by chemical vapor deposition (CVD). Since the submount 310 is jointed with the soldering material 312, when the light emitting diode illuminates, the generated heat can be quickly conducted out of the device via the submount 310. Thus, it is suitable for use in a light emitting diode with a high power. The operation current can reaches 50 mA to 70 mA to achieve the high power operation.

The conductive trace 314 can be formed on the submount 310 by electroplating or thin film technique. The material of the conductive trace 314 is required to have a good adhesion to the soldering material 312. A step of wire bonding is then performed. Using the photolithography technique accompanied with evaporation, electroplating, screen printing or planting, the soldering material 312 is fabricated on the conductive trace 312 as a solder bump, for example. The position of the solder bump is corresponding to the P-type and N-type electrodes of the light emitting diode chip 300. The number of the soldering materials 312 can be two or more than two. The larger number of the soldering materials 312 is advantageous for heat dissipation of the light emitting diode chip and the horizontal stability of the chip position.

The shape of the soldering material 312 can be cylinder or other shape, and the dimension thereof is smaller than the P-type and the N-type electrodes, for example, it is about ½ or ⅔ of the dimension of the P-type and N-type electrodes. The preferred height in this embodiment is about 5 micron to about 50 micron. The soldering material 312 can be fabricated on the submount 310 or on the P-type and N-type electrodes. By fabricating the soldering material 312 on the P-type and N-type electrodes, the alignment precision is widened while mounting the chip 300 on the submount 310. The mounting step can even be performed without using the flip chip bonder.

The light emitting diode chip 300 is mounted on the transparent substrate 302 with the transparent substrate 302 facing upwardly. When the soldering material 312 is located on the submount 310, using the flip chip bonder, the positions of the P-type and N-type electrodes, the submount 310 and the soldering material 312 can be observed to perform the position alignment, pressuring and heating steps for mounting. The adhesion between chip 300 and a submount 310 is performed one by one. In another approach, the submount 310 is not cut into individually until all the chips are positioned and aligned, and all the chips are mounted to the corresponding submounts. The latter approach using the chip bonder has an advantage that a heating step is not required. Therefore, the design and structure with the aid using the chip bonder are simple, low cost and can be fabricated fast in mass production. As the soldering material is not adhesive to the chip before being heated, so that a flux is used to prevent the chip from shifting or fall out of the position due to vibration. In the post process, a step of cleaning the flux is required.

For the package of the lamp type white light emitting diode, a paste with a high thermal conductivity is used to fix the chip 300 on the submount 310 in the reflector 330 on the lead frame 316. The surface of the chip 300 must be far lower than the edge of the reflector 330, so that the light emitted from the chip 300 can be reflected from the reflector and collected for output. The conductive wire 318 is electrically connected to the conductive trace 314 on the submount 310 and the external lead of the lead frame 316. The translucidus resin 320 containing fluorescent power is affused into the reflector 330 to completely cover the chip 30 or the various lenses extending outwardly.

The fluorescent power contained in the fluorescent paste 320 can absorb the optical energy of the primary color light emitted by the chip and emit a light. The lights emitted by the fluorescent paste 320 and the chip are mixed to form a white light to output. For example, when the primary light emitted from the chip is blue, an organic or inorganic material that may generate a yellow light is used as the fluorescent power. If the primary light is an ultraviolet (UV) light, the fluorescent light may adapts an organic or inorganic material to absorb an ultraviolet light and to generate red, blue and green lights.

Figure 4:
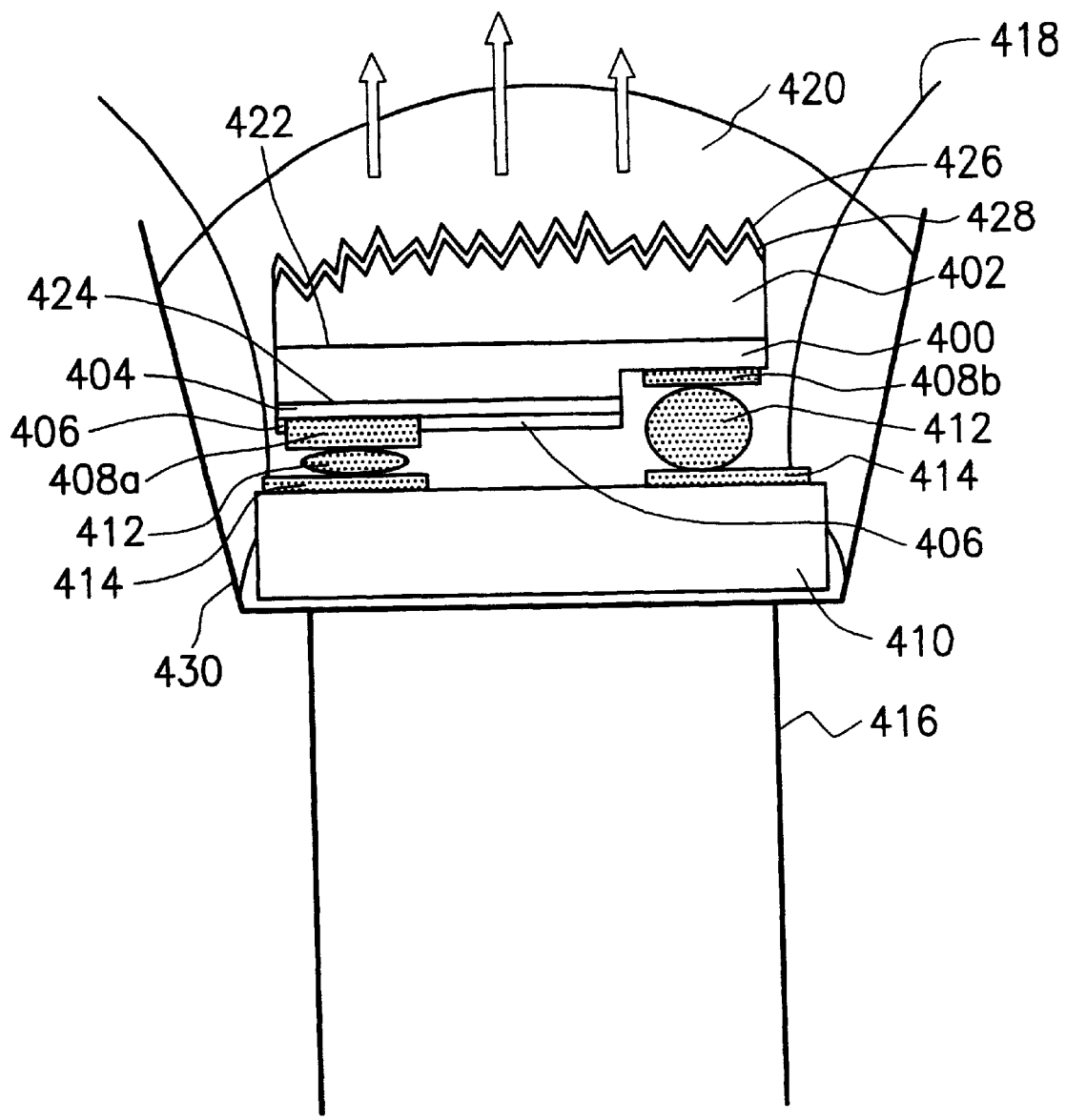
FIG. 4 shows a structure of a white light emitting diode comprising a non-metal reflection layer according to a first embodiment of the invention.

In FIG. 4, another high efficiency white light emitting diode is illustrated. The structure is similar to the device as shown in FIG. 3. The white light emitting diode comprises a light emitting diode chip 400, a transparent substrate 402, an anti-reflection layer 426, a transparent Ohmic electrode 404, a reflection layer 406, a first and second contact electrodes 408a, 408b, a submount 410, a soldering material 412 and a fluorescent paste 420. The light emitting diode chip 400 has a first and a second surfaces 422 and 424. The transparent substrate 402 comprises a roughened surface 428. The submount 410 comprising a conductive trace 414 thereon is used to carry the light emitting diode chip 400.

In FIG. 4, the reflection layer 406 is made of a non-metal material. Therefore, a portion of the reflection layer 406 has to be removed to expose a portion of the transparent Ohmic electrode 404. The first contact electrode 408a is then in contact with the Ohmic electrode 404 through the reflection layer 406 to provide a path of current conductance. Optical thin films with a high refractive index and optical thin films with a low refractive index can be alternately stacked to form an interference multi-layer device for different purpose. This stacked optical thin film can be used for the reflection layer 406.

Figure 5:
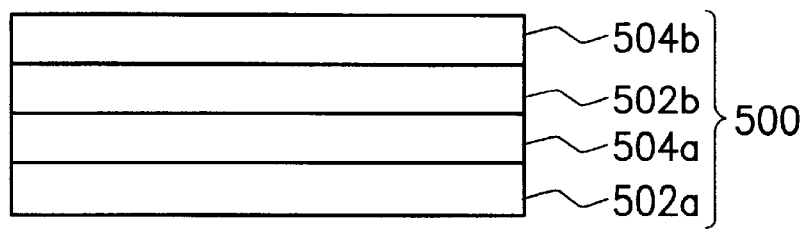
FIG. 5 shows a cross sectional view of the non-metal reflection layer in FIG. 4.

In FIG. 5, a cross sectional view of the non-metal reflection layer 500 (that is, the reflection layer 406 as shown in FIG. 4) is shown. The reflection layer 500 comprises an optical thin film 502a with a high refractive index, an optical thin film 504a with a high refractive index, an optical thin film 502b with a high refractive index, and an optical thin film 504b with a low refractive index stacked in sequence. The total layers of the optical thin films are not limited. In this embodiment, the optical thin films 502a and 502b have a refractive index higher than 2.0. Material such as bismuth trioxide ($Bi_2O_3$), cerium oxide ($CeO_2$), titanium oxide ($TiO_2$), zirconium dioxide ($ZrO_2$) can be used for forming the optical thin films 502a and 502b. The optical thin films 504a and 504b have a refractive index smaller than about 1.5 such as calcium fluoride ($CaF_2$), magnesium fluoride ($MgF_2$), silicon dioxide ($SiO_2$) and aluminum.

In FIG. 4, the arrangement of the light emitting diode chip 400, the transparent substrate 402, the anti-reflection layer 426, the transparent Ohmic electrode, the second contact electrode, the submount 410, the soldering material 412 and the fluorescent paste is the same as FIG. 3.

Second Embodiment

Figure 6:
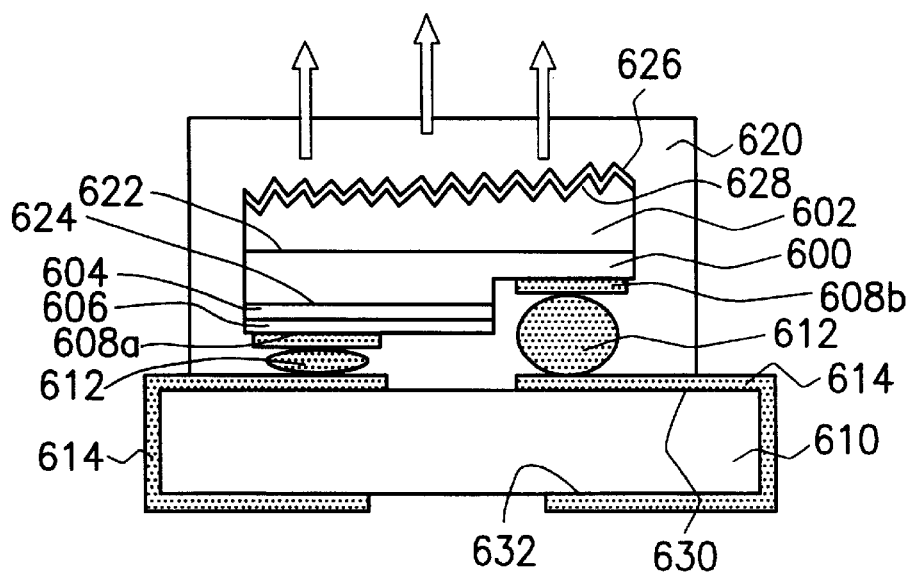
FIG. 6 shows a structure of a surface mounting type white light emitting diode according to a second embodiment of the invention.

The white light emitting diode can also be packaged as a surface mounting device. In FIG. 6, a white light emitting diode using the surface mounting technology is illustrated. Similarly, the surface mounting type light emitting diodes have the same devices as the white light emitting diode in the first embodiment. It includes a light emitting diode 600, a transparent substrate 602, an anti-reflection layer 626, a transparent Ohmic electrode 604, a reflection layer 606, a first contact diode 608a, a second contact diode 608b, a submount 610, a soldering material 612 and a fluorescent paste 620. The light emitting diode chip 600 comprises a first surface 622 and a second surface 624. The transparent substrate 602 has a roughened surface 602. The submount 610 comprising a conductive trace 614 thereon is used to carry the light emitting diode 600.

As shown in FIG. 6, the submount 610 comprises a first mounting surface 630 and a second mounting surface 632.

The conductive trace 614 is formed on both the first and the second mounting surfaces 630 and 632 to provide the required electric conduction. The white light emitting diode can be electrically connected to external devices via the conductive trace 614 on the second mounting surface 632 by the surface mounting technique.

The method for fabricating the light emitting diode is also similar to that in the first embodiment. For example, the steps of flip chip for the chip, heating adhesion, molding, are performed prior to cutting the submount into individuals.

Similar to the first embodiment as shown in FIG. 3, the reflection layer 606 adhered on the transparent Ohmic electrode 604 can be selected by metal plating layer or non-metal material. In FIG. 6, the material of the reflection 406 is a metal plating layer. The materials and positions of the light emitting diode 600, the transparent substrate 602, the anti-reflection layer 626, the transparent Ohmic electrode 604, the contact electrodes 608a, 608b, the submount 610, the soldering material 612 and the fluorescent paste 620 are similar to those as shown in FIG. 3.

When a non-metal material is selected to form the reflection layer, the connection between the transparent Ohmic electrode, the reflection layer and the contact electrode are the same as that in FIG. 4. That is, a portion of the reflection layer has to be removed to expose a portion of the transparent Ohmic electrode. The contact electrode can thus be electrically connected to the transparent Ohmic electrode to achieve the objective of current conduction. Therefore, FIG. 6 is only an example for depicting the connection relationship between the transparent Ohmic electrode, the reflection layer and the contact electrodes. The layout can be modified according to specific requirement without being restricted to this example. When the reflection layer is made of non-metal layer, a stack of optical thin films with high and low refractive indices can be used as shown in FIG. 5.

Figure 7:
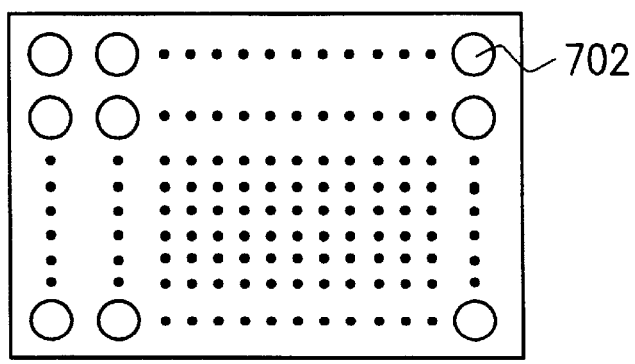
FIG. 7 shows a structure of a plan illumination device using a white light emitting diode according to the invention.

The white light emitting diode can be applied to fabricate a white light emitting diode used for large area illumination. In FIG. 7, a plan illumination device is illustrated. As shown in FIG. 7, the large area illumination device 700 comprises an area array of white light emitting diodes 702.

In this embodiment, the top view of each white light emitting diodes 702 is in a round shape, and the array is in a rectangular shape. This configuration is only an example and the practical application is not restricted to this example. That is, the white light emitting diodes in different shape can be used, and different configuration of the large area illumination device can be formed.

Using the surface mounting type white light emitting diode as an example, by directly coating the fluorescent paste on the submount carrying the light emitting diode chip without cutting, a large area illumination device, for example, a liquid crystal display, can be obtained. The fabrication process is similar to the above embodiments. The conductive trace on the submount is designed according to the requirements of the distribution of the light emitting diodes and a driving circuit. Being through the steps of flip chip process, heating adhesion and molding, the device is fabricated.

The invention comprises of combining a roughened surface, special P-type electrode, the introduction of the flip chip technique and the coating of the appropriate fluorescent powder. The roughened surface, the special P-type electrode and the flip chip technique can fabricate a high efficiency blue light emitting diode. With the addition of appropriate fluorescent powder, a white light emitting diode can be obtained. The output of light is greatly enhanced for roughening the surface. The flip chip technique enables 100% of the surface to emit a light.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A high efficiency white light emitting diode, comprising:
   a light emitting diode chip, comprising a first surface and a second surface;
   a transparent substrate, disposed on the first surface of the light emitting diode chip and having a roughened surface;
   a transparent Ohmic electrode, disposed on the second surface of the light emitting diode chip with an edge portion of the second surface exposed;
   a reflection reflection layer, disposed on the transparent Ohmic electrode, so that the transparent Ohmic electrode is located between the light emitting diode and the reflection reflection layer;
   a first contact electrode, disposed on the metal reflection layer to electrically connect the transparent Ohmic electrode via the metal reflection layer;
   a second contact electrode, disposed on exposed edge portion of the second surface;
   a submount, comprising at least two conductive traces corresponding to the first contact electrode and the second contact electrode respectively, the light emitting diode chip being disposed on the submount via a flip chip technique;
   a plurality of soldering materials, disposed on one of the first contact electrode and the corresponding conductive traces and one of the second contact electrode and the corresponding conductive traces thereof, to electrically connect the first contact electrode with its corresponding conductive trace and the second contact electrode with its corresponding conductive trace; and
   a fluorescent paste, disposed on the transparent substrate to cover the light emitting diode.

2. The white light emitting diode according to claim 1, wherein the light emitting diode chip comprises a blue light emitting diode chip.

3. The white light emitting diode according to claim 1, wherein the fluorescent paste comprising a fluorescent powder to absorb a portion of a light emitted by the light emitting diode chip and to generate a complementary light to result in a white light.

4. The white light emitting diode according to claim 1, wherein the roughened surface of the transparent substrate has a roughness of about 0.1 micron to about 1.0 micron.

5. The white light emitting diode according to claim 1, wherein the roughened surface includes a regular rabbet surface.

6. The white light emitting diode according to claim 1, further comprises an anti-reflection layer disposed on the roughened surface to enhance the output efficiency of the light.

7. The white light emitting diode according to claim 1, wherein the metal reflection layer is selected from a group of metals comprising silver and aluminum.

8. The white light emitting diode according to claim 1, wherein the material of the submount comprises a high thermal conductive material.

9. The white light emitting diode according to claim 1, wherein the material of the submount is selected from a group of materials comprising artificial diamond, aluminum nitride, aluminum oxide, and silicon carbide.

10. The white light emitting diode according to claim 1, wherein the soldering materials are selected from a group comprising tin-gold alloy, tin-lead alloy, tin-silver alloy and indium.

11. The white light emitting diode according to claim 1, further comprising:
a lead frame, comprising a reflector thereon to carry the submount therein; and
two conductive wires, arranged between the conductive traces and the lead frame for electrical connection.

12. The white light emitting diode according to claim 11, wherein the material of the conductive wires is selected from a group comprising gold and aluminum.

13. The white light emitting diode according to claim 1, wherein the submount comprises a first mounting surface and a second mounting surface, and the conductive traces are located on the first mounting surface and extending to the second mounting surface, the portion of the conductive traces extending on the second mounting surface electrically connects to an external device via a surface mounting technique.

14. A white light illuminating device, comprising:
a plurality of white light emitting diodes arranged as an array, wherein each white light emitting diode further comprises:
a light emitting diode, comprising a first and a second surface;
a transparent substrate on the first surface with a roughened surface;
a transparent Ohmic electrode, on the second surface;
a metal reflection layer, on the transparent Ohmic electrode, such that the transparent Ohmic electrode is formed between the transparent substrate and the metal reflection layer;
a first contact electrode, on the metal reflection layer to electric connect the metal reflection layer;
a second contact electrode, disposed on an exposed edge portion of the second surface;
a submount, comprising at least two conductive traces, respectively corresponding to the first and the second contact electrodes, the light emitting diode chip being mounted on the submount by a flip chip technique;
a plurality of soldering,
a plurality of soldering materials, on one of the conductive traces and the second contact electrode, and the other one of the conductive traces and the second contact electrode, so as to electrically connect one of the conductive traces to the second contact electrode and the other to the first contact electrode;
a flourescent paste, located on the transparent substrate to cover the light emitting diode chip.

15. The white light emitting diode according to claim 14, wherein the light emitting diode chip comprises a blue light emitting diode chip.

16. The white light emitting diode according to claim 14, wherein the fluorescent paste comprising a fluorescent powder to absorb a portion of a light emitted by the light emitting diode chip and to generate a complementary light to result in a white light.

17. The white light emitting diode according to claim 14, wherein the roughened surface of the transparent substrate has a roughness of about 0.1 micron to about 1.0 micron.

18. The white light emitting diode according to claim 14, wherein the roughened surface includes a regular rabbet surface.

19. The white light emitting diode according to claim 14, further comprises an anti-reflection layer disposed on the roughened surface to enhance the output efficiency of the light.

20. The white light emitting diode according to claim 14, wherein the metal reflection layer is selected from a group of metals comprising silver and aluminum.

21. The white light emitting diode according to claim 14, wherein the material of the submount comprises a high thermal conductive material.

22. The white light emitting diode according to claim 21, wherein the material of the submount is selected from a group of materials comprising artificial diamond, aluminum nitride, aluminum oxide, and silicon carbide.

23. The white light emitting diode according to claim 14, wherein the soldering materials are selected from a group comprising tin-gold alloy, tin-lead alloy, tin-silver alloy and indium.

* * * * *